US 10,886,192 B2

(12) United States Patent
Lim et al.

(10) Patent No.: US 10,886,192 B2
(45) Date of Patent: Jan. 5, 2021

(54) SEMICONDUCTOR PACKAGE

(71) Applicant: SAMSUNG ELECTRONICS CO., LTD., Suwon-si (KR)

(72) Inventors: Jae Hyun Lim, Suwon-si (KR); Han Kim, Suwon-si (KR); Yoon Seok Seo, Suwon-si (KR); Sang Jong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/821,305

(22) Filed: Mar. 17, 2020

(65) Prior Publication Data

US 2020/0219783 A1 Jul. 9, 2020

Related U.S. Application Data

(63) Continuation of application No. 16/110,436, filed on Aug. 23, 2018, now Pat. No. 10,607,914.

(30) Foreign Application Priority Data

Mar. 5, 2018 (KR) .................. 10-2018-0025747

(51) Int. Cl.
*H01L 23/367* (2006.01)
*H01L 23/498* (2006.01)
(Continued)

(52) U.S. Cl.
CPC ........ *H01L 23/367* (2013.01); *H01L 23/3128* (2013.01); *H01L 23/49822* (2013.01);
(Continued)

(58) Field of Classification Search
CPC ............... H01L 23/367; H01L 23/3675; H01L 23/3121–3128; H01L 23/49822; H01L 2225/1094
See application file for complete search history.

(56) References Cited

U.S. PATENT DOCUMENTS 9,076,754 B2 * 7/2015 Hung ................. H01L 23/42
2003/0227751 A1 12/2003 Wang
(Continued)

FOREIGN PATENT DOCUMENTS

CN 102867793 A 1/2013
KR 10-2008-0001589 A 1/2008
(Continued)

OTHER PUBLICATIONS

Taiwanese Office Action dated Feb. 27, 2019 issued in Taiwanese Patent Application No. 107128699.
(Continued)

*Primary Examiner* — Errol V Fernandes
*Assistant Examiner* — Jeremy J Joy
(74) *Attorney, Agent, or Firm* — Sughrue Mion, PLLC

(57) ABSTRACT

A semiconductor package includes a first semiconductor package including a core member having a through-hole, a first semiconductor chip disposed in the through-hole and having an active surface with a connection pad disposed thereon, a first encapsulant for encapsulating at least a portion of the first semiconductor chip, and a connection member disposed on the active surface of the first semiconductor chip and including a redistribution layer electrically connected to the connection pad of the first semiconductor chip, a second semiconductor package disposed on the first semiconductor package and including a wiring substrate electrically connected to the connection member, at least one second semiconductor chip disposed on the wiring substrate, and a second encapsulant for encapsulating at least a portion of the second semiconductor chip, and a heat dissipation member covering a lateral surface of the second semiconductor package and exposing an upper surface of the second encapsulant.

20 Claims, 13 Drawing Sheets

(51) Int. Cl.
 H01L 23/31 (2006.01)
 H01L 25/10 (2006.01)
 H01L 23/00 (2006.01)
(52) U.S. Cl.
 CPC ...... *H01L 23/49838* (2013.01); *H01L 25/105* (2013.01); *H01L 23/49827* (2013.01); *H01L 24/48* (2013.01); *H01L 2224/48227* (2013.01); *H01L 2225/107* (2013.01); *H01L 2225/1094* (2013.01); *H01L 2924/15311* (2013.01); *H01L 2924/19101* (2013.01)

(56) References Cited

U.S. PATENT DOCUMENTS

| | | |
|---|---|---|
| 2005/0036291 A1 | 2/2005 | Huang et al. |
| 2008/0001283 A1* | 1/2008 | Lee .................. H01L 25/0657 257/712 |
| 2008/0067672 A1 | 3/2008 | Katoh et al. |
| 2010/0002405 A1* | 1/2010 | Hsu .................... H01L 23/367 361/764 |
| 2011/0147916 A1* | 6/2011 | Su ....................... H01L 23/42 257/692 |
| 2011/0227209 A1* | 9/2011 | Yoon .................. H01L 24/73 257/686 |
| 2011/0304036 A1 | 12/2011 | Son |
| 2012/0018885 A1 | 1/2012 | Lee et al. |
| 2012/0119346 A1* | 5/2012 | Im ...................... H01L 23/552 257/690 |
| 2013/0043581 A1* | 2/2013 | Negoro ................ H01L 23/36 257/712 |
| 2013/0208426 A1* | 8/2013 | Kim .................... H01L 23/36 361/717 |
| 2013/0270685 A1* | 10/2013 | Yim .................... H01L 25/105 257/686 |
| 2014/0327129 A1* | 11/2014 | Cho .................... H01L 23/552 257/713 |
| 2014/0339708 A1* | 11/2014 | Jang ................... H01L 23/5389 257/777 |
| 2015/0001708 A1* | 1/2015 | Lin .................... H01L 23/5389 257/737 |
| 2015/0137345 A1* | 5/2015 | Choi .................. H01L 23/04 257/713 |
| 2015/0162307 A1* | 6/2015 | Chen .................. H01L 21/56 257/712 |
| 2015/0228580 A1* | 8/2015 | Chen .................. H01L 25/0657 257/531 |
| 2015/0235915 A1* | 8/2015 | Liang ................. H01L 21/486 361/764 |
| 2015/0348865 A1* | 12/2015 | Vincent ............. H01L 24/03 257/712 |
| 2016/0056100 A1* | 2/2016 | Yeh .................... H01L 23/5389 257/676 |
| 2016/0133557 A1* | 5/2016 | Mortensen .......... H01L 24/11 257/738 |
| 2016/0172334 A1* | 6/2016 | Hsu .................... H01L 24/19 257/692 |
| 2016/0197033 A1* | 7/2016 | Lin .................... H05K 3/4697 257/737 |
| 2016/0322332 A1* | 11/2016 | Kim ................... H01L 25/105 |
| 2017/0358557 A1* | 12/2017 | Chen .................. H01L 25/50 |
| 2018/0053732 A1* | 2/2018 | Baek .................. H01L 23/552 |

FOREIGN PATENT DOCUMENTS

| | | |
|---|---|---|
| KR | 10-2011-0134689 A1 | 12/2011 |
| KR | 10-2012-0014952 A | 2/2012 |
| KR | 10-2013-0132163 A | 12/2013 |
| KR | 10-2014-0130920 A | 11/2014 |
| KR | 10-2015-0058940 A | 5/2015 |
| TW | 546796 B | 8/2003 |
| TW | 200507212 A | 2/2005 |
| TW | 200818425 A | 4/2008 |
| TW | 201234542 A | 8/2012 |
| TW | 201807793 A | 3/2018 |

OTHER PUBLICATIONS

Communication dated Jul. 16, 2019, issued by the Taiwanese Patent Office in counterpart Taiwanese Application No. 107128699.
Communication dated Sep. 2019, issued by the Korean Intellectual Property Office in counterpart Korean Application No. 10-2018-0025747.

* cited by examiner

SEMICONDUCTOR PACKAGE

CROSS-REFERENCE TO THE RELATED APPLICATION(S)

This application is a continuation of U.S. application Ser. No. 16/110,436, filed Aug. 23, 2018, which claims benefit of priority to Korean Patent Application No. 10-2018-0025747 filed on Mar. 5, 2018 in the Korean Intellectual Property Office, the disclosure of which is incorporated herein by reference in its entirety.

TECHNICAL FIELD

The present disclosure relates to a semiconductor package.

BACKGROUND

In the field of semiconductor packaging technology, in accordance with a rapid increase in demand for small-sized semiconductor chips, or the like, the implementation of a semiconductor package, having a compact size while including a plurality of pins, and a system in package (SiP) package requiring complexation and multifunctionality have been demanded. One type of semiconductor package technology suggested to satisfy the technical demand is a fan-out semiconductor package. Such a fan-out package has a compact size and may allow a plurality of pins to be implemented by redistributing electrical connection structures outwardly of a region in which a semiconductor chip is disposed.

In particular, a recently developed package-on-package (POP) structure is configured by stacking upper and lower packages and, thus, there is a need for a structure for effectively dissipating heat generated by a semiconductor chip of the upper package while minimizing a thickness of the package.

SUMMARY

An aspect of the present disclosure may provide a semiconductor package with enhanced heat dissipation characteristics.

According to an aspect of the present disclosure, a package-on-package (POP) package is configured by arranging a heat sink around an upper package.

For example, an semiconductor package according to an embodiment proposed by the present disclosure may include a first semiconductor package including a core member having a through-hole, a first semiconductor chip disposed in the through-hole of the core member and having an active surface with a connection pad disposed thereon and a non-active surface opposing the active surface, a first encapsulant for encapsulating at least a portion of the first semiconductor chip, and a connection member disposed on the active surface of the first semiconductor chip and including a redistribution layer electrically connected to the connection pad of the first semiconductor chip, a second semiconductor package disposed on the first semiconductor package and including a wiring substrate electrically connected to the connection member through a connection terminal, at least one second semiconductor chip disposed on the wiring substrate, and a second encapsulant for encapsulating at least a portion of the second semiconductor chip, and a heat dissipation member covering a lateral surface of the second semiconductor package and exposing an upper surface of the second encapsulant.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
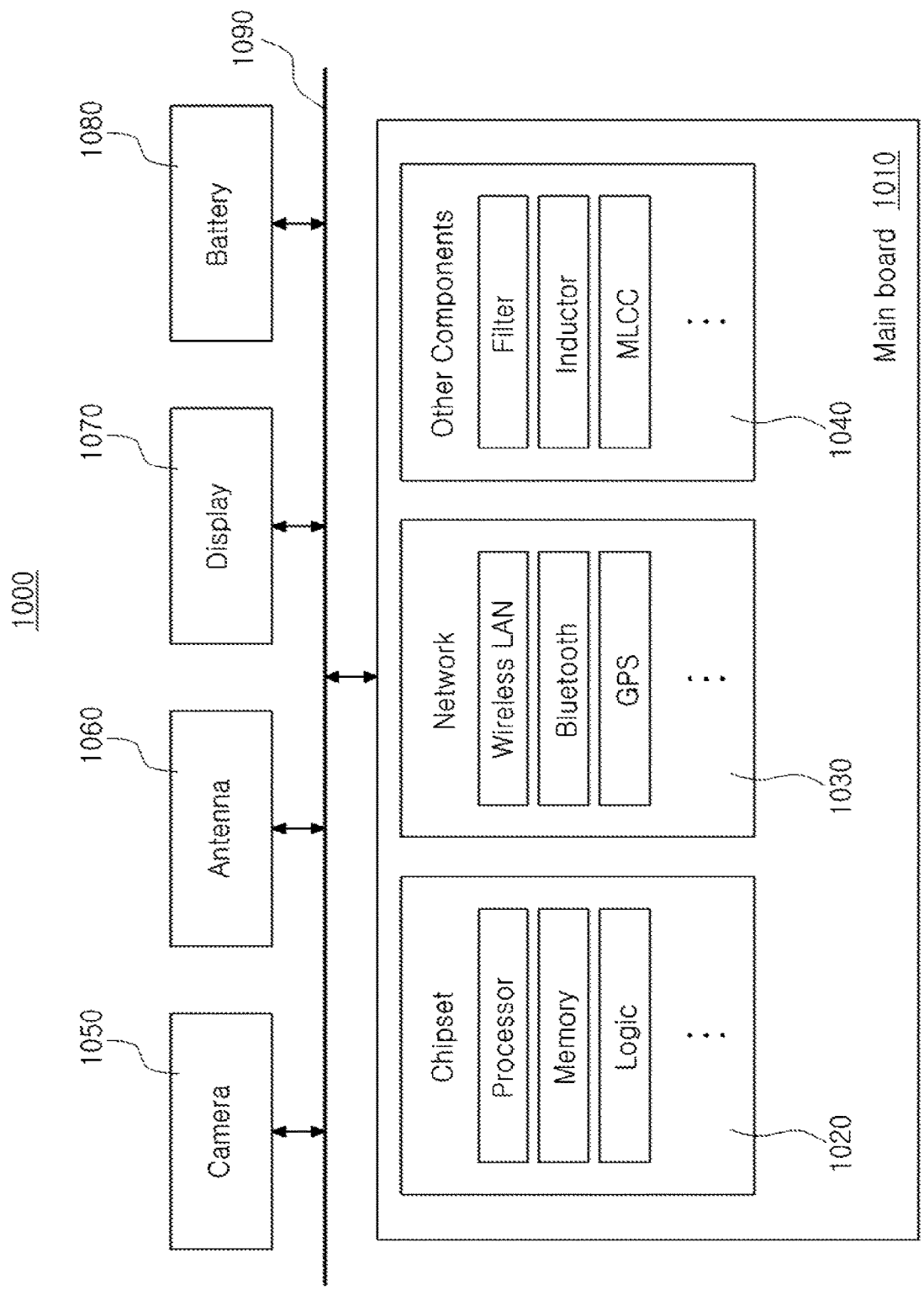
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected to thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.<0}

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
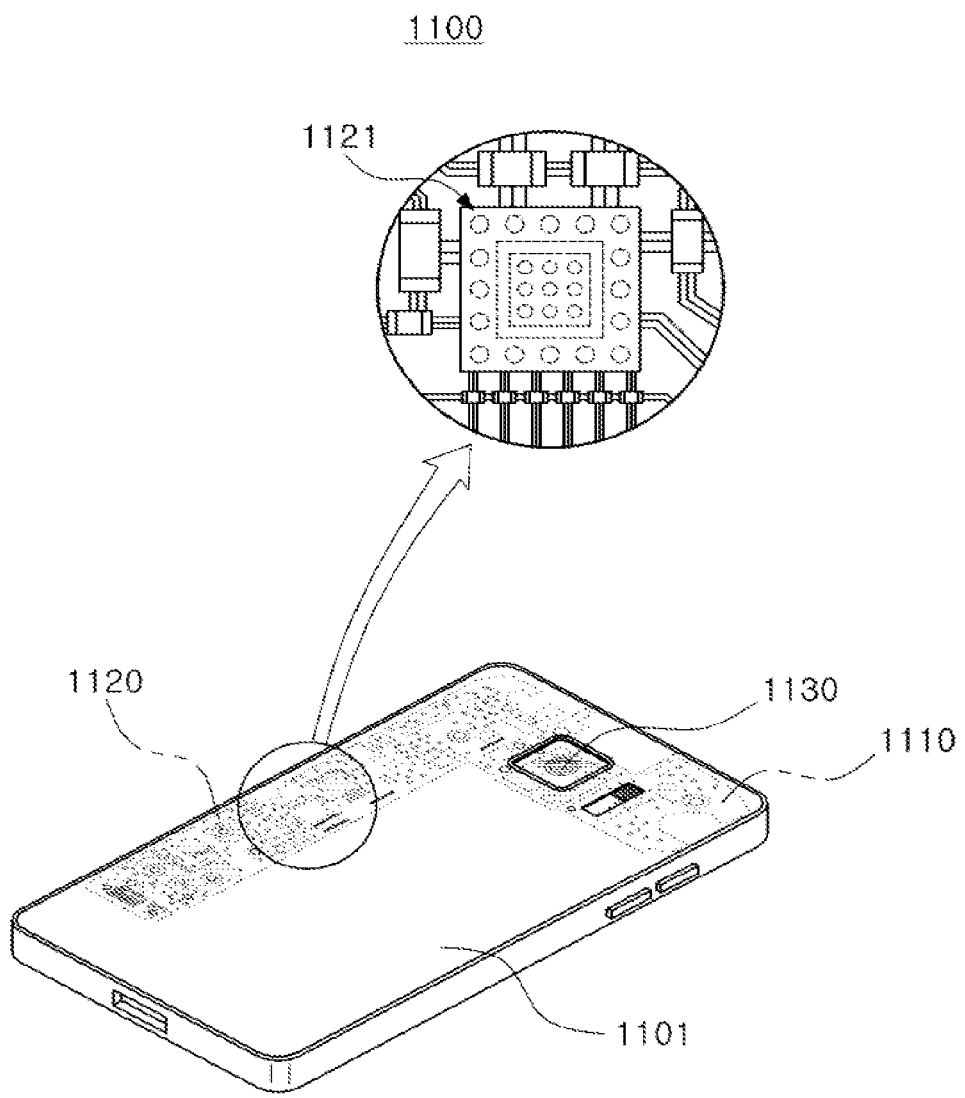
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
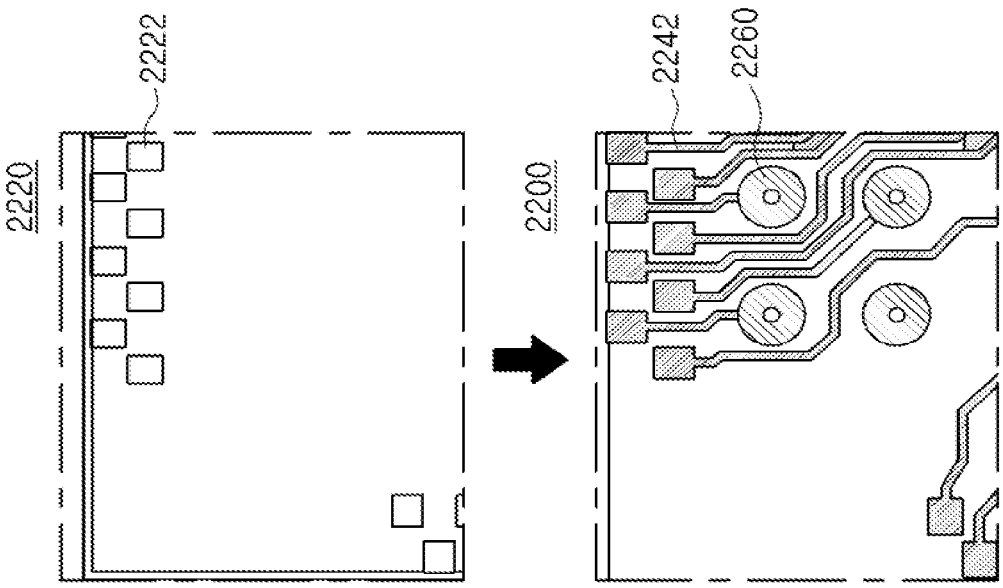
FIGS. 3A and 3B are schematic cross-sectional views illustrating states of a fan-in semiconductor package before and after being packaged.
Figure 3A:
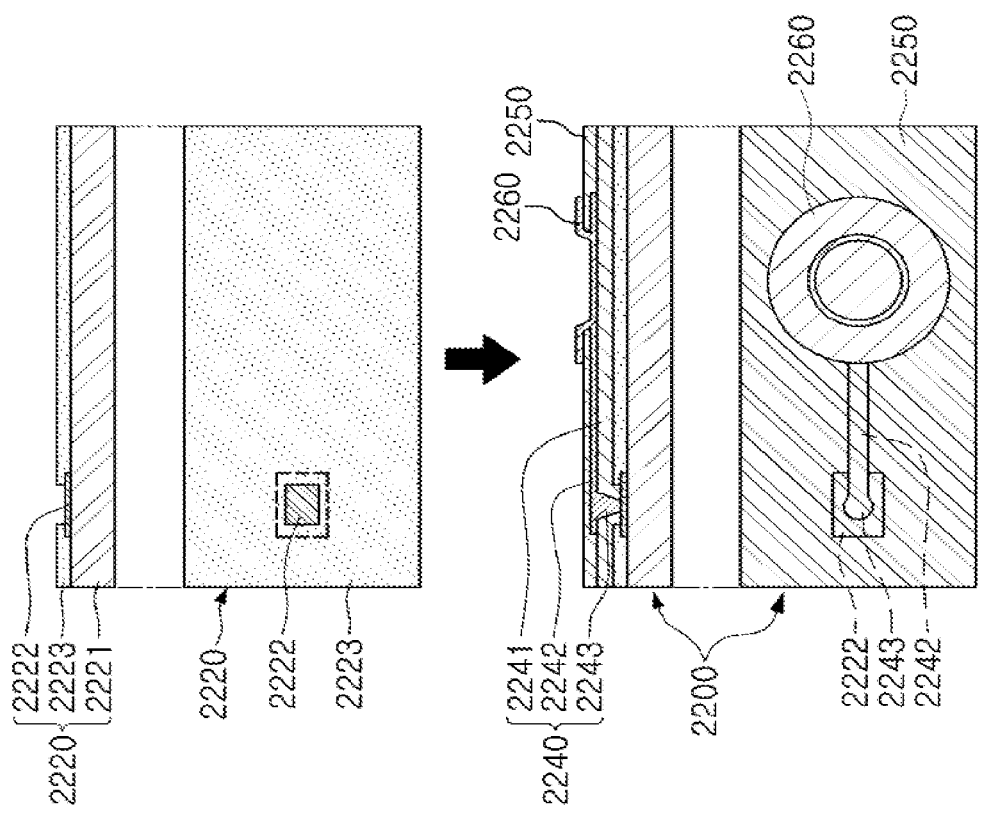

FIGS. 3A and 3B are schematic cross-sectional views illustrating states of a fan-in semiconductor package before and after being packaged.

Figure 4:
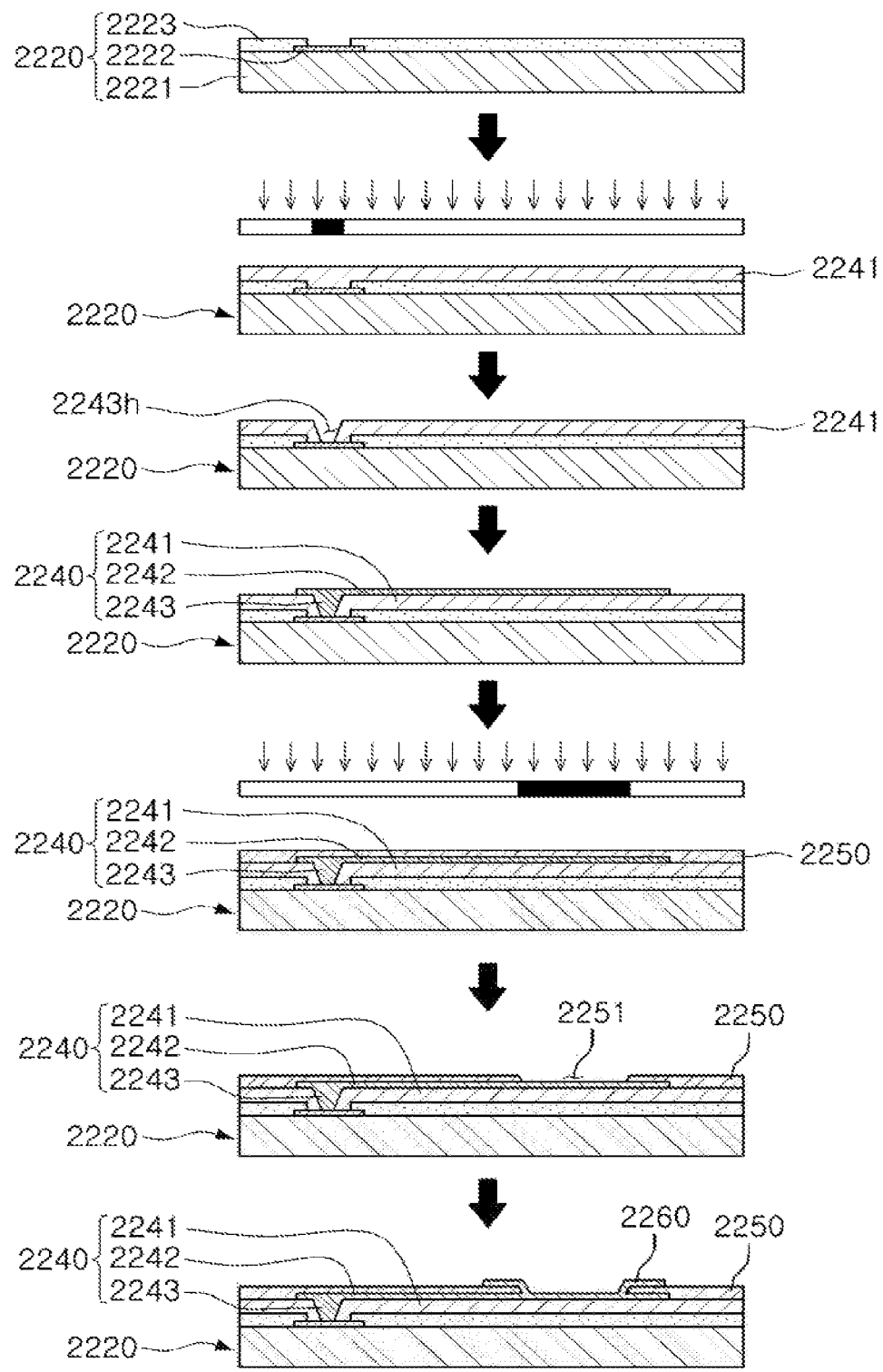
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least a portion of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
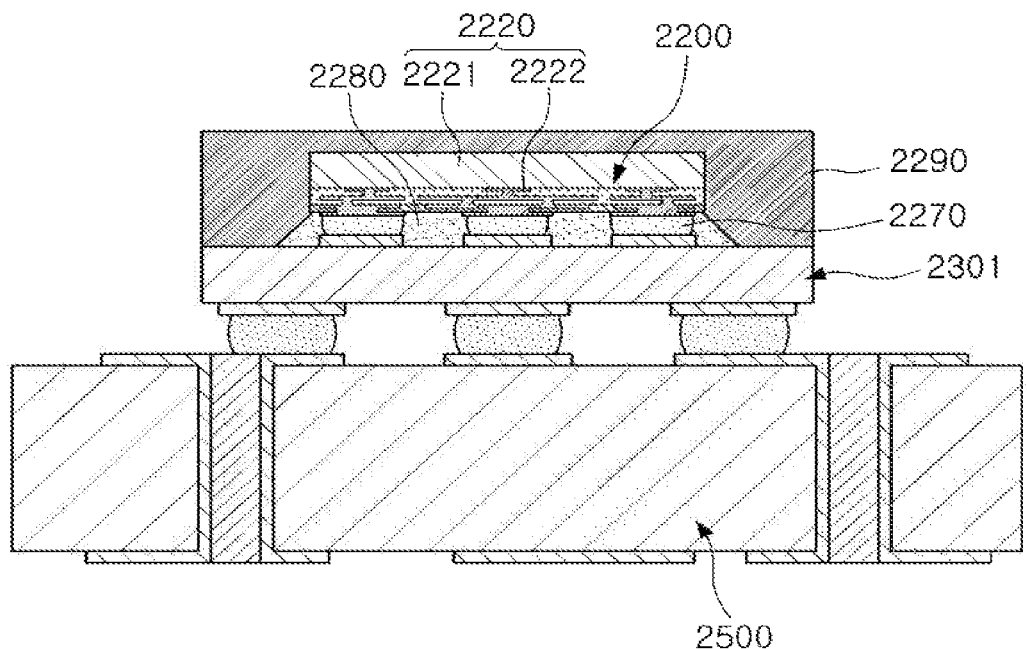
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
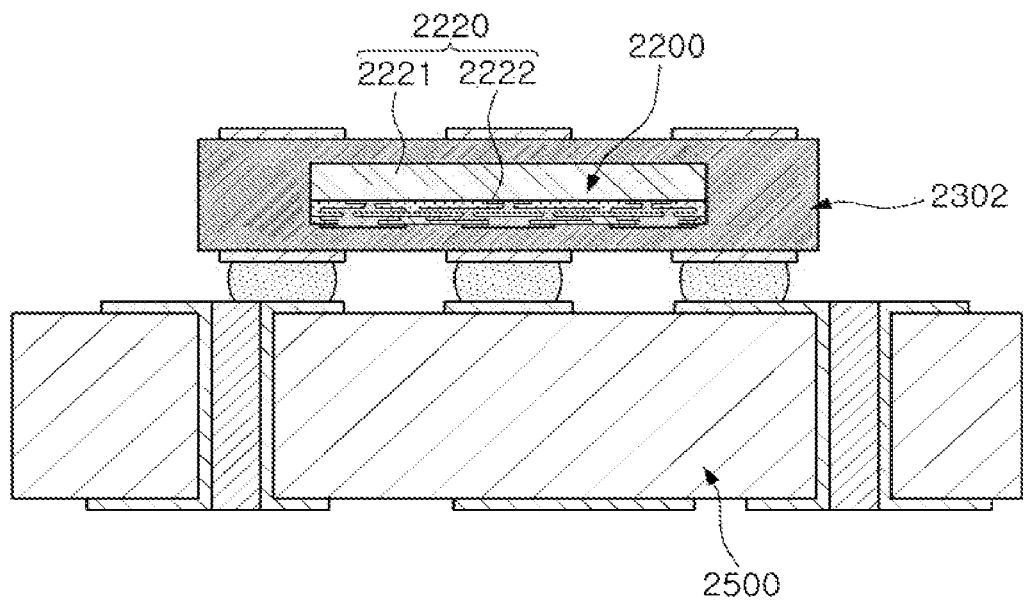
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 22 90, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
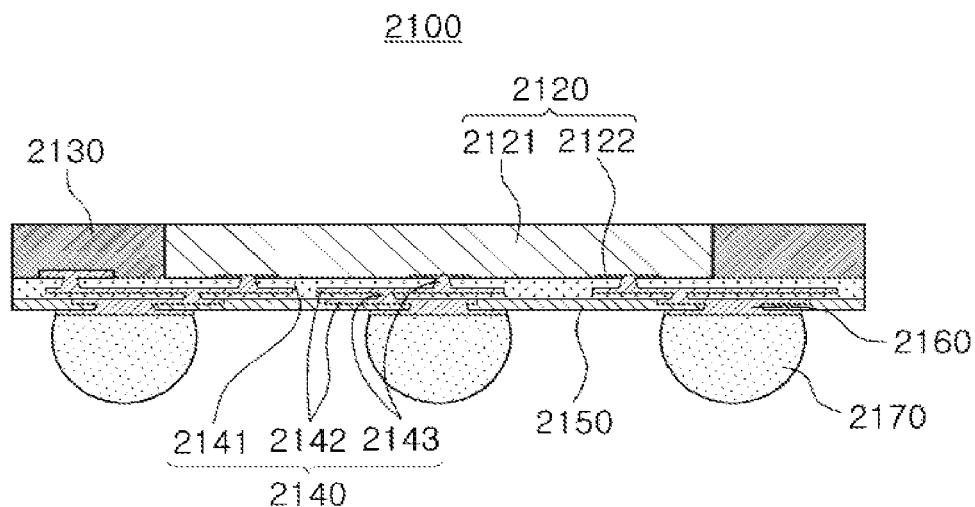
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
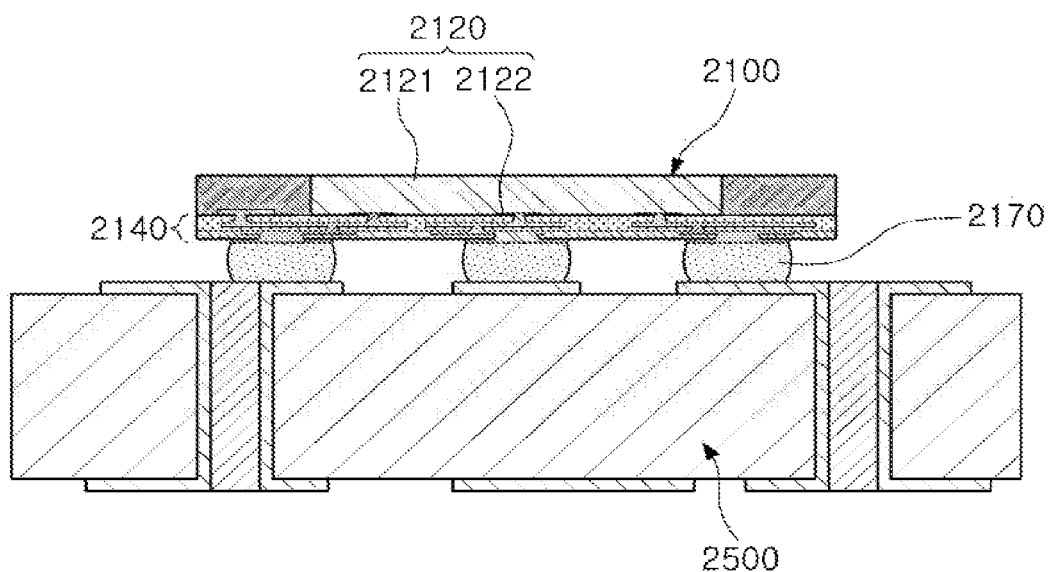
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
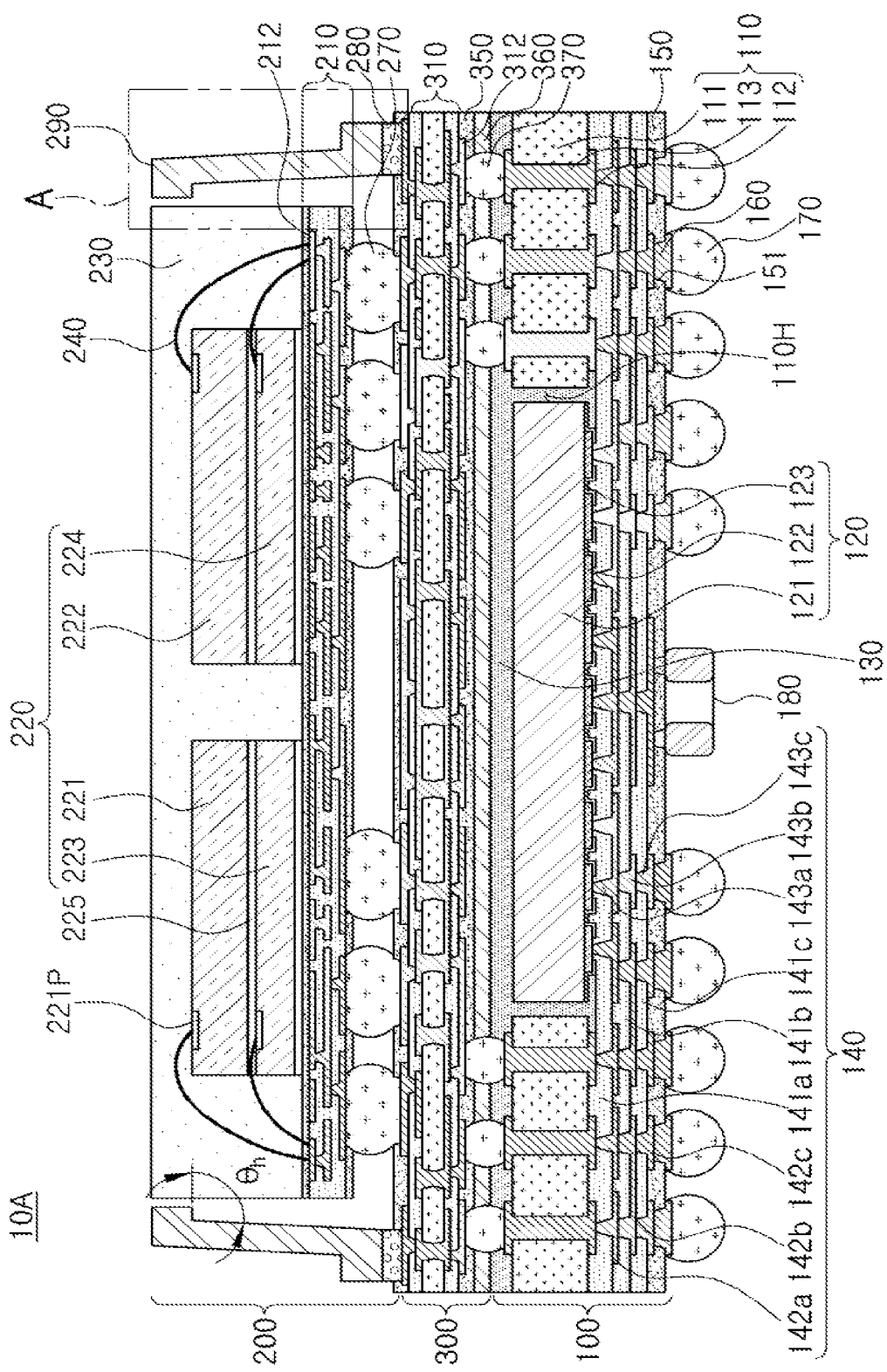
FIG. 9 is a schematic cross-sectional view of a semiconductor package according to an embodiment.

FIG. 9 is a schematic cross-sectional view of a semiconductor package according to an embodiment.

Figure 10A:
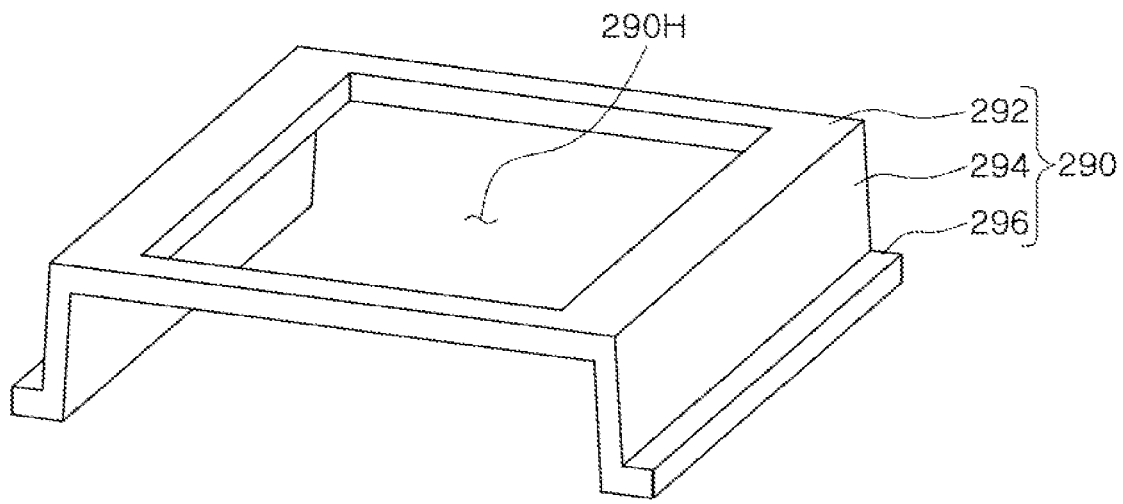
FIGS. 10A and 10B are schematic perspective views illustrating a heat dissipation member of a semiconductor package.
Figure 10B:
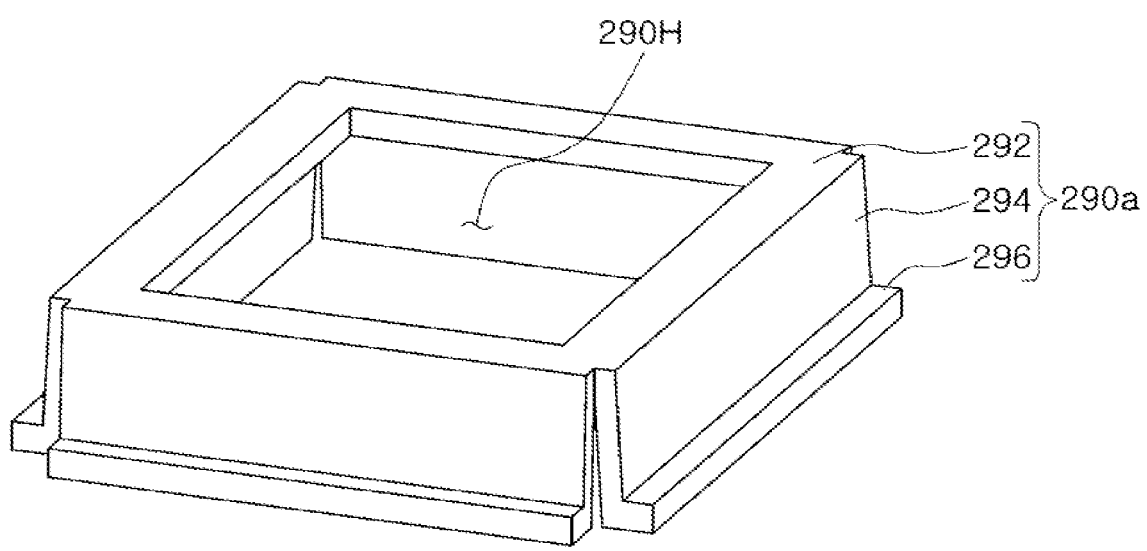

FIGS. 10A and 10B are schematic perspective views illustrating a heat dissipation member of a semiconductor package.

Figure 11A:
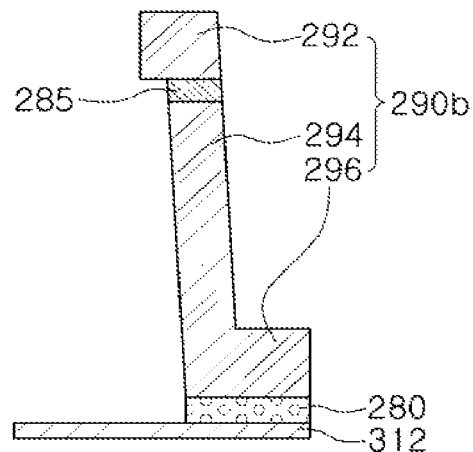
FIGS. 11A and 11B are schematic cross-sectional views illustrating a region 'A' of the semiconductor package of FIG. 9 according to embodiments.
Figure 11B:
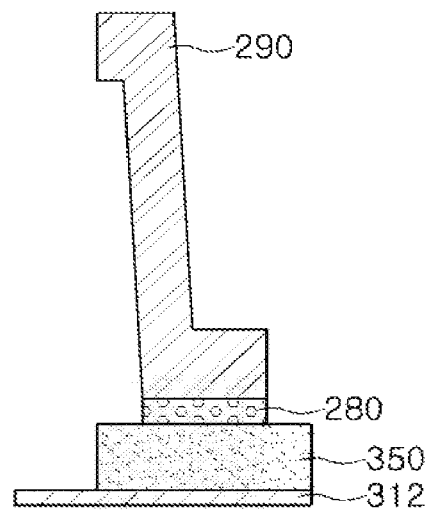

FIGS. 11A and 11B are schematic cross-sectional views illustrating a region 'A' of the semiconductor package of FIG. 9 according to embodiments.

Referring to the drawings, a semiconductor package 10A according to an embodiment may be a POP structure including a first semiconductor package 100 and a second semiconductor package 200 that are vertically stacked, an interposer substrate 300 may be interposed between the first semiconductor package 100 and the second semiconductor package 200, and a heat dissipation member 290 may be disposed around the second semiconductor package 200. The first semiconductor package 100 may include a core member 110 having a through-hole 110H, a semiconductor chip 120 disposed on the through-hole 110H of the core member 110 and having an active surface with connection pads 122 disposed thereon and an inactive surface opposing the active surface, a first encapsulant 130 for encapsulating at least a portion of the core member 110 and the semiconductor chip 120, a connection member 140 formed on the core member 110 and the active surface of the semiconductor chip 120, a passivation layer 150 disposed on the connection member 140, underbump metals 160 disposed on openings 151 of the passivation layer 150, the electrical connection structures 170 disposed on the passivation layer 150 and connected to the underbump metals 160, and a passive component 180 disposed on the passivation layer 150. The second semiconductor package 200 may include a wiring substrate 210, a plurality of second semiconductor chips 220 disposed on the wiring substrate 210, a second encapsulant 230 for encapsulating the second semiconductor chips 220, and an upper connection terminal 270 disposed below the wiring substrate 210.

In the case of a POP structure, as semiconductor chips are stacked in up and down directions, heat is seriously generated to degrade performance of the semiconductor chips and, when a heat dissipation member is installed to prevent this problem, there is a problem in that a package is increased in size. However, in the case of the semiconductor package 10A according to an embodiment, the first semiconductor package 100 as a fan-out semiconductor package may be introduced while the main semiconductor chip 120 such as an AP chip is mounted, the heat dissipation member 290 may be disposed around the second semiconductor package 200 and the semiconductor chips 220 such as a memory chip with high thermal resistance is disposed on the semiconductor chip 120, thus, heat dissipation properties may be ensured without increase in a package thickness.

The respective components included in the semiconductor package 10A according to the exemplary embodiment will hereinafter be described in more detail.

The core member 110 may improve rigidity of the semiconductor package 10A depending on certain materials, and serve to secure uniformity of a thickness of the first encapsulant 130. The semiconductor package 10A according to the exemplary embodiment may be used as a part of the POP by the core member 110. The core member 110 may have the through-hole 110H. A peripheral portion of a lateral surface of the first semiconductor chip 120 may be surrounded by the core member 110. However, such a form is only an example and may be variously modified to have other forms, and the core member 110 may perform another function depending on such a form. Alternatively, the core member 110 may be omitted but, when the core member 110 is used to advantageously improve board level reliability intended by the present disclosure.

The core member 110 may include a core insulating layer 111, wiring layers 112 arranged on opposite surfaces of the core insulating layer 111, and core via layers 113 penetrating through the core insulating layer 111 to connect the upper and lower wiring layers 112. Accordingly, the wiring layers 112 arranged on the opposite surfaces of the core insulating layer 111 may be electrically connected to each other through the core via layers 113.

An insulating material may be used as a material of the core insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. The core member 110 may function as a support member.

The wiring layers 112 may redistribute the connection pad 122 of the first semiconductor chip 120. A material of each of the wiring layers 112 may be a conductive material such as copper (Cu), aluminum (Al), silver (Ag), tin (Sn), gold (Au), nickel (Ni), lead (Pb), titanium (Ti), or alloys thereof. The wiring layers 112 may perform various functions depending on designs of corresponding layers. For example, the wiring layers 112 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112 may include via pads, wire pads, connection terminal pads, and the like.

The core via layers 113 may electrically connect the wiring layers 112 formed on different layers to each other, resulting in an electrical path in the core member 110. A material of the core via layers 113 may also be a conductive material. Each of the core via layers 113 may be completely filled with the conductive material, or the conductive material may also be formed along a wall of each of via holes. In addition, each of the core via layers 113 may have any well-known shape such as a cylindrical shape as well as a tapered shape.

The first semiconductor chips 120 may each be an integrated circuit (IC) in which several hundreds to several millions of devices are integrated in one chip. The first semiconductor chips 120 may be a processor chip such as a central processor (e.g., CPU), a graphics processor (e.g., GPU), a field programmable gate array (FPGA), a digital signal processor, a cryptographic processor, a microprocessor, a microcontroller, or the like, in detail, an application processor (AP). However, the first semiconductor chips 120 are not limited thereto, but may be a logic chip such as an analog-digital converter or an application-specific IC (ASIC) or a memory chip such as a volatile memory (e.g., DRAM) or non-volatile memory (e.g., ROM and flash memory) but are not limited thereto. These may be combined with each other.

The first semiconductor chip 120 may have an active surface having the connection pad 122 disposed thereon and an inactive surface opposing the active surface. The first semiconductor chip 120 may be formed on the basis of an active wafer. In this case, a base material of a body 121 of the first semiconductor chip 120 may be silicon (Si), germanium (Ge), gallium arsenide (GaAs), or the like. Various circuits may be formed on the body 121. The connection pads 122 may electrically connect the first semiconductor chip 120 to other components. A material of each of the connection pads 122 may be a conductive material such as aluminum (Al) or the like. A passivation layer 123 exposing the connection pads 122 may be formed on an active surface of the body 121, and may be an oxide layer, a nitride layer, or the like, or a double layer of an oxide layer and a nitride layer. A lower surface of the connection pad 122 may have a step with respect to a lower surface of the first encapsulant 130 through the passivation layer 123 and a phenomenon that the first encapsulant 130 bleeds into the lower surface of the connection pad 122 may be prevented to some degree. An insulating layer (not illustrated), and the like, may also be further disposed in other required positions.

The first encapsulant 130 may protect the core member 110, the first semiconductor chip 120, and the like. An encapsulation form of the first encapsulant 130 is not particularly limited, but may be a form in which the first encapsulant 130 surrounds at least a portion of the first semiconductor chip 120. For example, the first encapsulant 130 may cover at least a portion of the core member 110 and the first semiconductor chip 120 and may fill at least a portion of a space between a wall of the through-hole 110H and a lateral surface of the first semiconductor chip 120. Meanwhile, the first encapsulant 130 may fill the through-hole 110H to thus serve as an adhesive and reduce buckling of the first semiconductor chip 120 depending on certain materials. A material of the first encapsulant 130 is not particularly limited. For example, an insulating material may be used as the material of the first encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photo imageable dielectric (PID) resin may also be used.

The connection member 140 may redistribute the connection pads 122 of the first semiconductor chip 120. Several tens to several hundreds of connection pads 122 of the first semiconductor chip 120 having various functions may be redistributed by the connection member 140, and may be physically and/or electrically externally connected through the electrical connection structures 170 depending on functions. The connection member 140 may include a first insulating layer 141a disposed on the core member 110 and the active surface of the first semiconductor chip 120, a first redistribution layer 142a disposed on the first insulating layer 141a, a first via 143a connecting the first redistribution layer 142a and the connection pad 122 of the semiconductor chip 120, a second insulating layer 141b disposed on the first insulating layer 141a, a second redistribution layer 142b disposed on the second insulating layer 141b, a second via 143b penetrating the second insulating layer 141b to connect the first and second redistribution layers 142a and 142b, a third insulating layer 141c disposed on the second insulating layer 141b, a third redistribution layer 142c disposed on the third insulating layer 141c, and a third via 143c penetrating the third insulating layer 141c to connect the second and third redistribution layers 142b and 142c. The first to third redistribution layers 142a, 142b, and 142c may be electrically connected to the connection pad 122 of the first semiconductor chip 120.

A material of each of the insulating layers 141a, 141b, and 141c may be an insulating material. In this case, a photosensitive insulating material such as a PID resin may also be used as the insulating material. That is, each of the insulating layers 141a, 141b, and 141c may be a photosensitive insulating layer. When the insulating layers 141a, 141b, and 141c have photosensitive properties, the insulating layers 141a, 141b, and 141c may be formed to have a smaller thickness, and a fine pitch of the vias 143a, 143b, and 143c may be achieved more easily. Each of the insulating layers 141a, 141b, and 141c may be a photosensitive insulating layer including an insulating resin and an inorganic filler. When the insulating layers 141a, 141b, and 141c are multiple layers, materials of the insulating layers 141a, 141b, and 141c may be the same as each other, and may also be different from each other, if necessary. When the insulating layers 141a, 141b, and 141c are the multiple layers, the insulating layers 141a, 141b, and 141c maybe integrated with each other depending on a process, such that a boundary therebetween may also not be apparent. A larger number of insulating layers may be formed than in the case illustrated in the drawing.

The redistribution layers 142a, 142b, and 142c may substantially serve to redistribute the connection pads 122. A material of each of the redistribution layers 142a, 142b, and 142c may be a conductive material such as copper (Cu), aluminum (Al), silver (Ag), tin (Sn), gold (Au), nickel (Ni), lead (Pb), titanium (Ti), or alloys thereof. For example, a seed metal layer and a plating metal layer included in the redistribution layers 142a, 142b, and 142c may include copper (Cu) or alloys thereof and adhesive metal layers and may include titanium (Ti), or alloys thereof. However, the second adhesive metal layer may be an optional component and, in some embodiments, maybe omitted. The redistribution layers 142a, 142b, and 142c may perform various functions depending on designs of corresponding layers. For example, the redistribution layers 142a, 142b, and 142c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142a, 142b, and 142c may include via pad patterns, an electrical connection structure pad pattern, and the like.

The vias 143a, 143b, and 143c may electrically connect the redistribution layers 142a, 142b, and 142c, the connection pads 122, and the like, formed on different layers to each other, resulting in an electrical path in the first semiconductor package 10A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. For example, the seed metal layer and a plating metal layer included in the vias 143a, 143b, and 143c may include copper (Cu) or alloys thereof and the adhesive metal layers and may include titanium (Ti), or alloys thereof. Each of the vias 143a, 143b, and 143c may be completely filled with the conductive material, or the conductive material may also be formed along a wall of each of via holes. Each of the vias 143a, 143b, and 143c may have any well-known shape such as a cylindrical shape as well as a tapered shape.

The passivation layer 150 may protect the connection member 140 from external physical or chemical damage. The passivation layer 150 may have openings 151 exposing at least a portion of the third redistribution layer 142c of the connection member 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metals 160 may improve connection reliability of the electrical connection structures 170 to improve board level reliability of the semiconductor package 10A. The underbump metals 160 may be connected to the third redistribution layer 142c of the connection member 140 exposed through the openings 151 of the passivation layer 150. The underbump metals 160 may be formed in the openings 151 of the passivation layer 150 by any known metallization method using any known conductive metal such as a metal, but is not limited thereto.

The electrical connection structures 170 may physically and/or electrically externally connect the semiconductor package 10A. For example, the semiconductor package 10A may be mounted on the mainboard of the electronic device through the electrical connection structures 170. Each of the electrical connection structures 170 may be formed of a conductive material, for example, a solder. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or a single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metals 160 extending onto one surface of the passivation layer 150, and connection reliability may be more excellent.

At least one of the electrical connection structures 170 may be disposed in a fan-out region of the first semiconductor chip 120. The fan-out package may have excellent reliability as compared to a fan-in package, may implement a plurality of input/output (I/O) terminals, and may facilitate a 3D interconnection. In addition, as compared to a ball grid array (EGA) package, a land grid array (LGA) package, or the like, the fan-out package may be manufactured to have a small thickness, and may have price competitiveness.

The passive component 180 may be arranged on a lower surface of the passivation layer 150 and may be arranged between the electrical connection structures 170. The passive component 180 may be electrically connected to the third redistribution layer 142c. The passive component 180 may include, for example, a surface mounting technology (SMT) component including an inductor, a capacitor, or the like.

Although not illustrated, alternatively, a metal thin film may be formed on a wall of the through-hole 110H for heat dissipation and/or electromagnetic wave shield. Alternatively, a plurality of semiconductor chips performing the same function or different functions may be arranged in the through-hole 110H. Alternatively, a separate passive component, for example, an inductor or a capacitor may be arranged in the through-hole 110H.

The interposer substrate 300 may be arranged on the first semiconductor package 100 and may be connected to the wiring layers 112 of the first semiconductor package 100 through lower connection terminals 370. The interposer substrate 300 may be a well-known printed circuit board (PCB). The interposer substrate 300 may include an insulating layer 310 and a conductive wiring layer 312 formed in the insulating layer 310. Passivation layers 350 may be formed on opposite surfaces of the interposer substrate 300. The interposer substrate 300 may have substantially the same or similar cross sectional area to the first semiconductor package 100 disposed therebelow on a plane. A structure and shape of the interposer substrate 300 may be changed in various ways in some embodiments.

Each of the lower connection terminals 370 may be formed of a conductive material, for example, a solder. However, this is only an example, and a material of each of the lower connection terminals 370 is not particularly limited thereto. Each of the lower connection terminals 370 may be a land, a ball, a pin, or the like.

An underfill layer 360 may fill a space between the lower connection terminals 370 and may be embedded in a space between the first semiconductor package 100 and the interposer substrate 300. The underfill layer 360 may be formed of resin, for example, epoxy resin. In some embodiments, the underfill layer 360 may be omitted.

The wiring substrate 210 of the second semiconductor package 200 may be a well-known printed circuit board (PCB) like an interposer substrate. The wiring substrate 210 may include an insulating layer and a conductive wiring layer 212 formed in the insulating layer. Passivation layers or the like may be formed on opposite surfaces of the wiring substrate 210. The wiring substrate 210 may have a smaller cross sectional area than the interposer substrate 300 disposed therebelow on a plane. Accordingly, the interposer substrate 300 may be exposed around the wiring substrate 210. A structure and shape of the wiring substrate 210 may be changed in various ways in some embodiments.

The second semiconductor chips 220 may include a plurality of semiconductor chips 221, 222, 223, and 224 that are stacked in parallel to each other. The second semiconductor chips 220 may be attached onto the wiring substrate 210 or the second semiconductor chips 220 disposed therebelow by an adhesive member 225. The second semiconductor chips 220 may be electrically connected to the wiring layer 212 of the wiring substrate 210 by a conductive wire 240 connected to a connection pad 221P. However, in some embodiments, the second semiconductor chips 220 may be flip-chip bonded onto the wiring substrate 210.

The second semiconductor chips 220 may each be an integrated circuit (IC) in which several hundreds to several millions of devices are integrated in one chip. The IC may be a memory chip, for example, a volatile memory (e.g., DRAM), a non-volatile memory (e.g., ROM and flash memory), or the like but is not limited thereto. Each of the second semiconductor chips 220 may have an active surface having the connection pad 221P disposed thereon and an inactive surface opposing the active surface. However, in some embodiments, the second semiconductor chips 220 may be arranged in a face-down form. The second semiconductor chips 220 may be formed on the basis of an active wafer. In this case, a base material of the second semiconductor chips 220 maybe silicon (Si), germanium (Ge), gallium arsenide (GaAs), or the like. Various circuits may be formed in the second semiconductor chips 220. The connection pad 221P may electrically connect the second semiconductor chips 220 to other components. A material of each of the connection pad 221P may be a conductive material such as aluminum (Al) or the like and is not particularly limited.

The adhesive member 225 may easily adhere the non-active surfaces of the second semiconductor chips 220 to the second semiconductor chips 220 disposed below or an upper surface of the wiring substrate 210. The adhesive member 225 may be, for example, a well-known tape such as a die attachment film (DAF). A material of the adhesive member 225 is not particularly limited. The adhesive member 225 may include, for example, an epoxy component but is not limited thereto. The second semiconductor chips 220 may be stably installed through the adhesive member 225, thereby enhancing reliability.

The second encapsulant 230 may protect the second semiconductor chips 220. An encapsulation form is not particularly limited as long as the second encapsulant 230 surrounds at least a portion of the second semiconductor chips 220. For example, the second encapsulant 230 may cover at least a portion of the active surface of the second semiconductor chips 220 and may cover at least a portion of a lateral surface of the second semiconductor chips 220. The second encapsulant 230 may include an insulating material.

The insulating material may be a photo imageable epoxy (PIE), PID, or the like. However, the insulating material is not limited thereto and may be a material including an inorganic filler and an insulating resin, for example, a thermosetting resin such as an epoxy resin, a thermoplastic resin such as a polyimide resin, or a resin in which a stiffener including an inorganic filler is mixed therewith and, in detail, may be ABF or the like. A well-known material such as EMC or the like may also be used. Alternatively, a material of the second encapsulant 230 may be a material in which the thermosetting resin or the thermoplastic resin is mixed with an inorganic filler or is impregnated together with an inorganic filler in a core material such as a glass fiber (or a glass cloth or a glass fabric).

The upper connection terminal 270 may electrically connect the wiring substrate 210 and the interposer substrate 300. The upper connection terminal 270 may be interposed between the wiring layer 212 of the wiring substrate 210 and the wiring layer 312 of the interposer substrate 300. The upper connection terminal 270 may be formed of a conductive material, for example, a solder. However, this is only an example, and a material of the upper connection terminal 270 may be a land, a ball, a pin, or the like.

The heat dissipation member 290 may be disposed on the interposer substrate 300 and may be disposed at least a portion of the second semiconductor package 200 around the second semiconductor package 200. The heat dissipation member 290 may not cover an upper surface of the second encapsulant 230 to upwardly expose an upper surface of the second semiconductor package 200, i.e., an upper surface of the second encapsulant 230. An upper surface of the heat dissipation member 290 may be positioned at substantially the same level as the upper surface of the second semiconductor package 200 or may be positioned at a lower level than the upper surface of the second semiconductor package 200. Accordingly, even if the heat dissipation member 290 is disposed, a thickness of the semiconductor package 10A may not be increased by the heat dissipation member 290. The heat dissipation member 290 may be spaced apart from a lateral surface of the second semiconductor package 200 at a predetermined interval but the present disclosure is not limited thereto. A material of the heat dissipation member 290 has excellent thermal conductive characteristics and may be a conductive material such as copper (Cu), aluminum (Al), silver (Ag), tin (Sn), gold (Au), nickel (Ni), lead (Pb), titanium (Ti), or alloys thereof.

As shown in FIG. 10A, the heat dissipation member 290 may include an upper portion 292 including openings 290H having the second semiconductor package 200 disposed thereon, a lateral surface portion 294 extending downward from the upper portion 292 along a lateral surface of the second semiconductor package 200, and a lower end portion 296 extending from the lateral surface portion 294 in a horizontal direction. A portion of the second semiconductor package 200 may insert in the opening 290H of the upper portion 292. The lateral surface portion 294 may extend downward along two lateral surfaces of the second semiconductor package 200. As such, the second semiconductor package 200 may be accommodated in a space defined by the lateral surface portion 294 and the upper portion 292 of the heat dissipation member 290. As shown in FIG. 10B, the lateral surface portion 294 of a heat dissipation member 290a may extend downward along all lateral surfaces of the second semiconductor package 200 and, in this case, the upper portion 292 may be more stably supported. Portions of the lateral surface portion 294 of the heat dissipation member 290a extending downward along two adjacent lateral surfaces of the second semiconductor package 200 may be spaced apart from each other. The heat dissipation member 290 may be bent in opposite directions from upper and lower ends of the lateral surface portion 294. Accordingly, the lower end portion 296 may extend in an opposite direction to the upper portion 292 based on the lateral surface portion 294. An angle 9h between the upper portion 292 and the lateral surface portion 294 and a length of the lower end portion 296 may be changed in various in some embodiments and may be selected in consideration of a size of the heat dissipation member 290, a cross section difference between the interposer substrate 300 and the second semiconductor package 200, and so on. For example, the angle 9h may have the range of 90° to 140° but is not limited thereto.

As shown in FIG. 11A, a heat dissipation member 290b may be formed in such a way that the upper portion 292 and the lateral surface portion 294 are separated from each other and the upper portion 292 and the lateral surface portion 294 may be connected to each other by a connection layer 285. In this case, the lateral surface portion 294 may have a form of stiffener. The connection layer 285 may be, for example, adhesive but is not limited thereto. The heat dissipation member 290 may be adhered to the interposer substrate 300 by an adhesive layer 280 and, as shown in FIGS. 9 and 11A, in particular, may be adhered to the wiring layer 312 of the interposer substrate 300. However, the present disclosure is not limited thereto. For example, as shown in FIG. 11B, the heat dissipation member 290 may be adhered to the passivation layers 350 of the interposer substrate 300.

Figure 12:
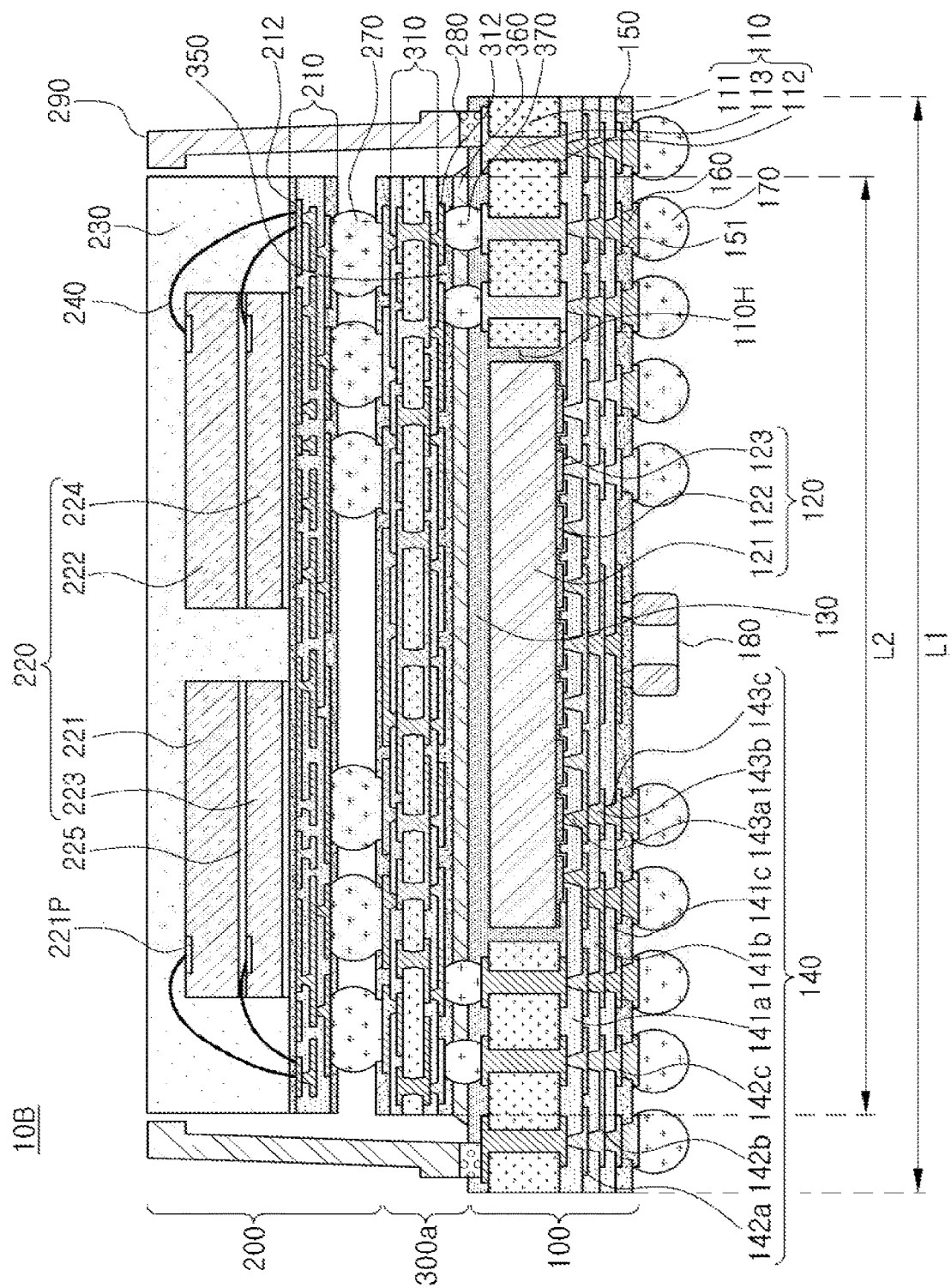
FIG. 12 is a schematic cross-sectional view of a semiconductor package according to another embodiment.

FIG. 12 is a schematic cross-sectional view of a semiconductor package according to another embodiment.

Referring to the drawing, a semiconductor package 10B according to another embodiment may be configured in such a way that an interposer substrate 300a has a smaller cross sectional area than the first semiconductor package 100 on a plane and the heat dissipation member 290 is adhered to the first semiconductor package 100. The interposer substrate 300a may have a smaller length L2 than a length LI of the first semiconductor package 100 in at least one direction and, accordingly, the heat dissipation member 290 may extend onto lateral surfaces of the second semiconductor package 200 and the interposer substrate 300a. A lower surface of the heat dissipation member 290 may be connected to the wiring layers 112 of the core member 110 but the present disclosure is not limited thereto. For example, the lower surface of the heat dissipation member 290 may be connected to the first encapsulant 130. A description of other components is substantially the same as the above description of the semiconductor package 10A according to the aforementioned example.

Figure 13:
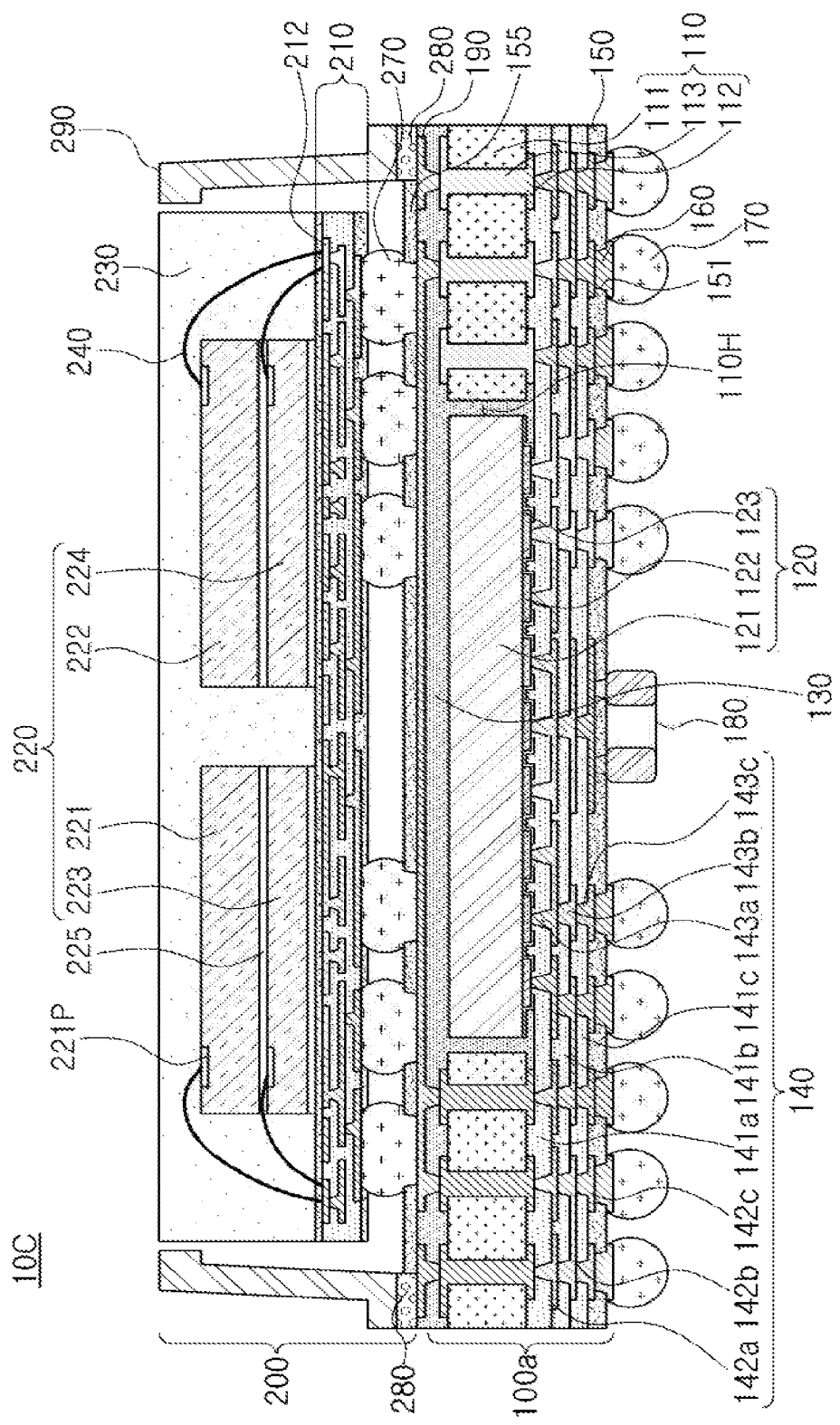
FIG. 13 is a schematic cross-sectional view of a semiconductor package according to another embodiment.

FIG. 13 is a schematic cross-sectional view of a semiconductor package according to another embodiment.

Referring to the drawing, a semiconductor package 10C according to another embodiment may include a first semiconductor package 100a and the second semiconductor package 200 and the second semiconductor package 200 may be connected directly to the first semiconductor package 100a by the upper connection terminal 270. That is, the semiconductor package 10C according to another embodiment does not include an interposer substrate and, thus, may have a more miniaturized package size. A lower surface of the heat dissipation member 290 may be adhered to the first semiconductor package 100a. The first semiconductor package 100a according to the present embodiment may further include a backside wiring structure 190 disposed on the first semiconductor chip 120 and the core member 110 and including a via and a wiring layer and may further include a backside passivation layer 155 on the backside wiring structure 190. The upper connection terminal 270 may be interposed between the wiring layer 212 of the wiring substrate 210 and the backside wiring structure 190. As such, the structure of the first semiconductor package 100a including the backside wiring structure 190 may also be applied to other embodiments. A description of other components and manufacturing methods are substantially the same as the above description of the semiconductor package 10A according to the aforementioned example and, thus, is omitted herein.

Figure 14:
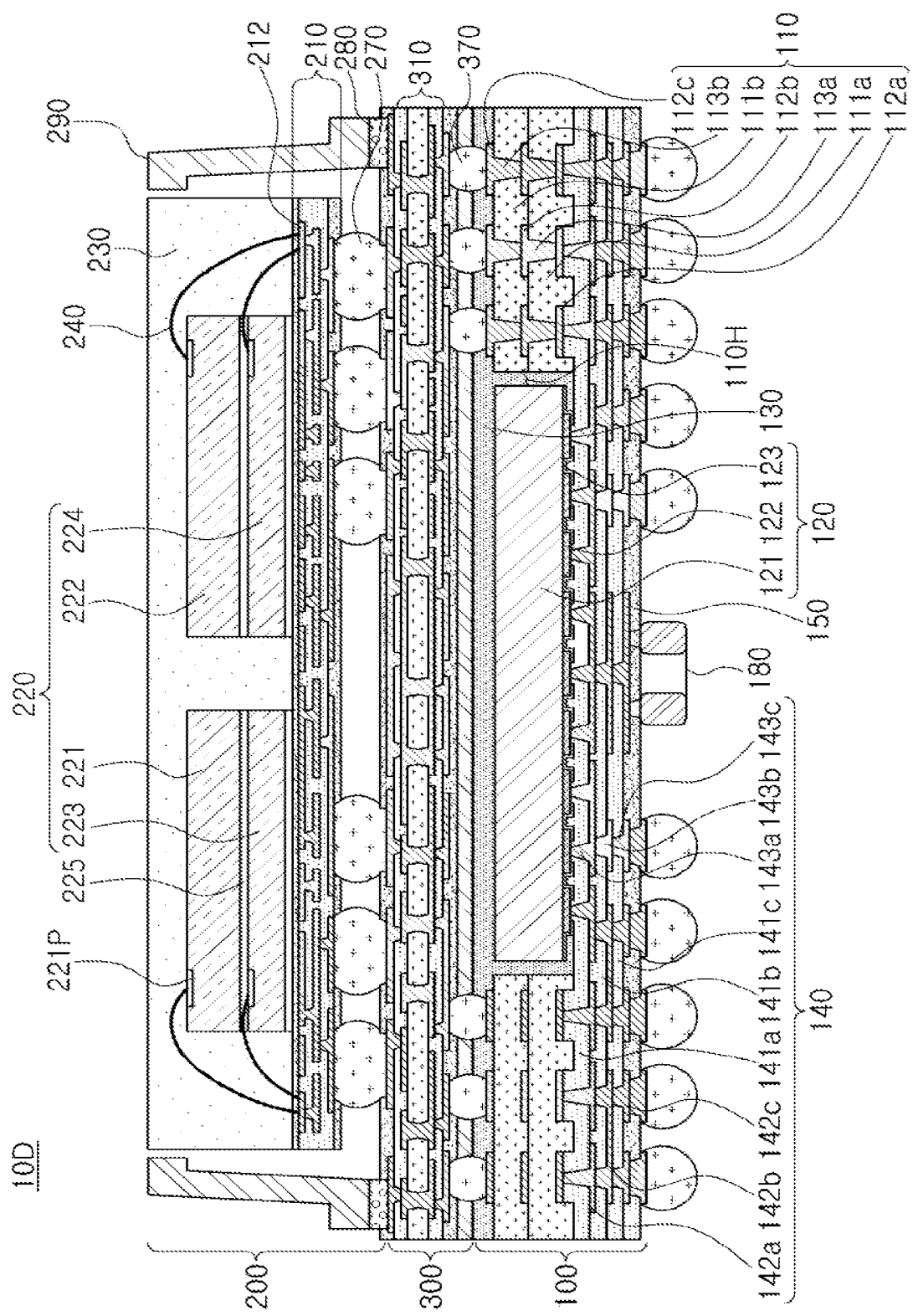
FIG. 14 is a schematic cross-sectional view of a semiconductor package according to another embodiment.

FIG. 14 is a schematic cross-sectional view of a semiconductor package according to another embodiment.

Referring to the drawing, a semiconductor package 10D according to another embodiment may include a first semiconductor package 100 having a core member 110. The core member 110 may include a first insulating layer 111a contacting the connection member 140, a first wiring layer 112a contacting the connection member 140 and embedded in the first insulating layer 111a, a second wiring layer 112b disposed at an opposite side to the side at which the first wiring layer 112a of the first insulating layer 111a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to the connection pad 122. The first and second wiring layers 112a and 112b and the second and third wiring layers 112b and 112c may be electrically connected to each other through the first and second vias 113a and 113b respectively penetrating the first and second insulating layers 111a and 111b.

When the first wiring layer 112a is embedded in the first insulating layer 111a, a step generated due to a thickness of the first wiring layer 112a may be significantly reduced, and an insulating distance of the connection member 140 may thus become constant. That is, a difference between a distance to a lower surface of the first insulating layer 111a from the first redistribution layer 142a of the connection member 140 and a distance to the connection pad 122 of the first semiconductor chip 120 from the first redistribution layer 142a of the connection member 140 may be smaller than a thickness of the first wiring layer 112a. Accordingly, a high-density wiring of the connection member 140 may be easily designed.

A lower surface of the first wiring layer 112a of the core member 110 may be disposed on a level above a lower surface of the connection pad 122 of the first semiconductor chip 120. A distance between the first redistribution layer 142a of the connection member 140 and the first wiring layer 112a of the core member 110 may be greater than a distance between the first redistribution layer 142a of the connection member 140 and the connection pad 122 of the first semiconductor chip 120. The reason is that the first wiring layer 112a may be recessed in the first insulating layer 111a. As such, when the first wiring layer 112a is recessed in the first insulating layer 111a, such that a lower surface of the first insulating layer 111a and a lower surface of the first wiring layer 112a may have a step therebetween, a phenomenon in which a material of an first encapsulant 130 bleeds to pollute the first wiring layer 112a may be prevented. The second wiring layer 112b of the core member 110 may be positioned between the active surface and the non-active surface of the first semiconductor chip 120. The core member 110 may be formed to a thickness corresponding to a thickness of the first semiconductor chip 120 and, accordingly, the second wiring layer 112b formed in the core member 110 may be arranged at a level between the active surface and the non-active surface of the first semiconductor chip 120.

A thickness of each of the wiring layers 112a, 112b, and 112c of the core member 110 may be greater than that of each of the redistribution layers 142a, 142b, and 142c of the connection member 140. The core member 110 may have a thickness equal to or greater than a thickness of the first semiconductor chip 120 and, thus, the wiring layers 112a, 112b, and 112c may also be formed with a relatively large size depending on a scale thereof. On the other hand, the redistribution layers 142a, 142b, and 142c of the connection member 140 may be formed with a relatively small size than the wiring layers 112a, 112b, and 112c for thinning.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The wiring layers 112a, 112b, and 112c may serve to redistribute the connection pads 122 of the first semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like.

The via layers 113a and 113b may electrically connect the wiring layers 112a, 112b, and 112c formed on different layers to each other, resulting in an electrical path in the core member 110. A material of each of the via layers 113a and 113b may be a conductive material. Each of the via layers 113a and 113b may be completely filled with the conductive material, or the conductive material may also be formed along a wall of each of via holes. Each of the via layers 113a and 113b may have any well-known shape such as a cylindrical shape as well as a tapered shape. When a hole for the first via 113a is formed, some pads of the first wiring layer 112a may function as a stopper and, thus, it is advantageous when the first via 113a has a tapered shape in which a width of an upper surface is greater than a lower surface in terms of a process. In this case, the first via 113a may be integrated with a pad pattern of the second wiring layer 112b. When a hole for the second via 113b is formed, some pads of the second wiring layer 112b may function as a stopper and, thus, it is advantageous when the second via 113b has a tapered shape in which a width of an upper surface is greater than a lower surface in terms of a process. In this case, the second via 113b may be integrated with a pad pattern of the third wiring layer 112c.

Other components, for example, the description of the heat dissipation member 290 of FIG. 9, etc. may also be applied to the semiconductor package 10D according to another embodiment and a detailed description thereof is substantially the same as the aforementioned semiconductor package 10A and, thus, is omitted herein. The core member 110 described with reference to FIG. 14 may be also be used in the first semiconductor package 100 shown in FIGS. 12 and 13.

Figure 15:
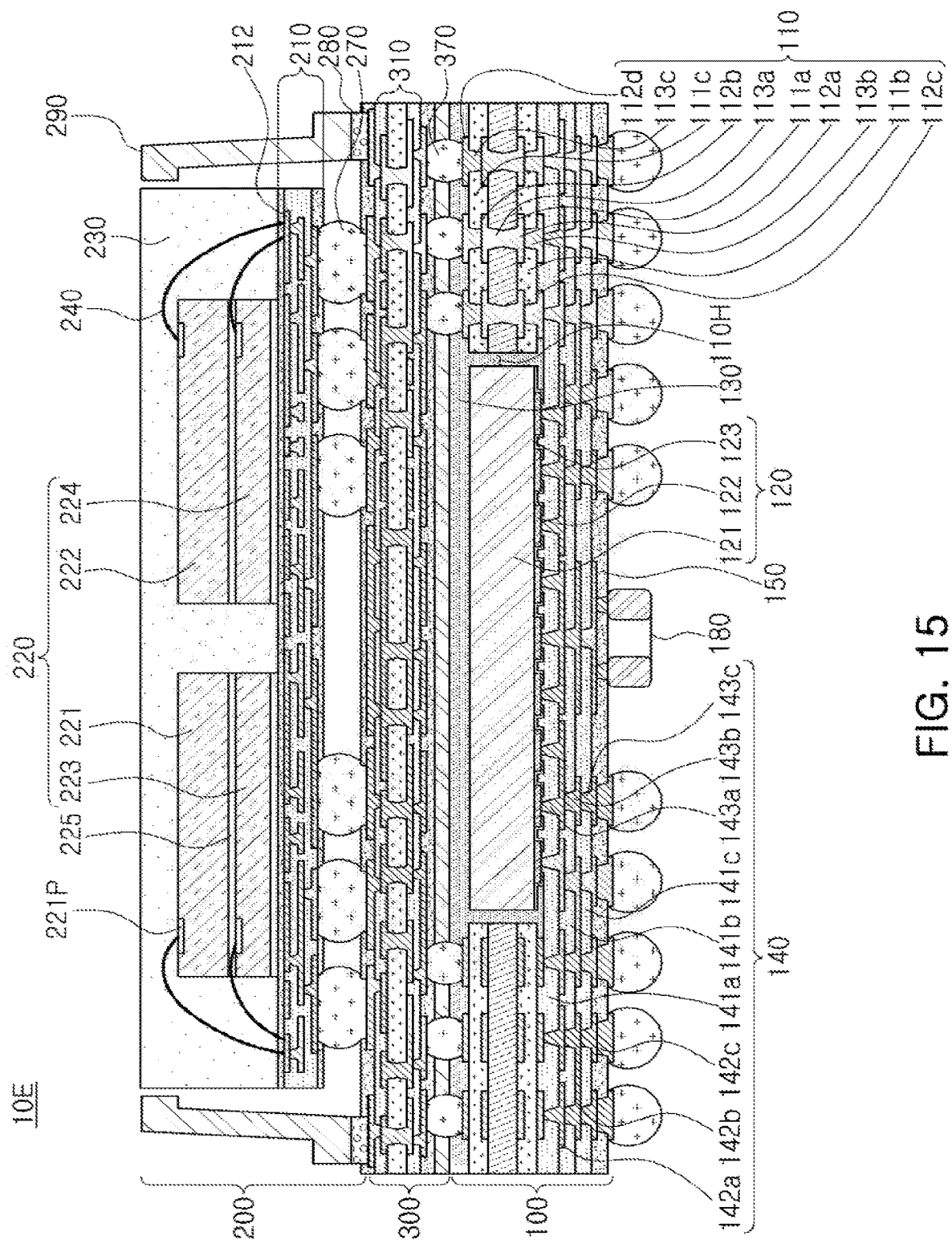
FIG. 15 is a schematic cross-sectional view of a semiconductor package according to another embodiment.

FIG. 15 is a schematic cross-sectional view of a semiconductor package according to another embodiment.

Referring to the drawing, a semiconductor package 10E according to another embodiment may include a first semiconductor package 100 having a core member 110. The core member 110 may include the first insulating layer 111a, the first wiring layer 112a and the second wiring layer 112b arranged on opposite surfaces of the first insulating layer 111a, the second insulating layer 111b disposed on the first insulating layer 111a and covering the first wiring layer 112a, a third redistribution layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122. Since the core member 110 may include a large number of wiring layers 112a, 112b, 112c, and 112d, a connection member 140 may be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third via layers 113a, 113b, and 113c respectively penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF film or a PID film including a filler and an insulating resin but the present disclosure is not limited thereto. Similarly, the first via layer 113a penetrating through the first insulating layer 111a may have a diameter greater than those of the second and third via layers 113b and 113c respectively penetrating through the second and third insulating layers 111b and 111c.

A lower surface of the third wiring layer 112c of the core member 110 may be disposed on a level below a lower surface of the connection pad 122 of a first semiconductor chip 120. In addition, a distance between the redistribution layer 142a of the connection member 140 and the core member 110 may be smaller than that between the first redistribution layer 142a of the connection member 140 and the third wiring layer 112c of the connection pad 122 of the first semiconductor chip 120. The reason is that the third wiring layer 112c may be disposed on the second insulating layer 111b in a protruding form, resulting in being in contact with the connection member 140. The first wiring layer 112a and the second wiring layer 112b of the core member 110 may be disposed on a level between an active surface and an inactive surface of the first semiconductor chip 120. The core member 110 may be formed to correspond to a thickness of the first semiconductor chip 120 and, thus, the first wiring layer 112a and the second wiring layer 112b formed in the core member 110 may be arranged at a level between the active surface and the non-active surface of the first semiconductor chip 120.

A thickness of each of the wiring layers 112a, 112b, 112c, and 112d of the core member 110 may be greater than that of each of the redistribution layers 142a, 142b, and 142c of the connection member 140. The core member 110 may have a thickness equal to or greater than a thickness of the first semiconductor chip 120 and, thus, the wiring layers 112a, 112b, 112c, and 112d may also be formed with a relatively large size depending on a scale thereof. On the other hand, the redistribution layers 142a, 142b, and 142c of the connection member 140 may be formed with a relatively small size for thinning.

Other components, for example, the description of the heat dissipation member 290 of FIG. 9, etc. may also be applied to the semiconductor package 10E according to another embodiment and a detailed description thereof is substantially the same as the aforementioned semiconductor package 10A and, thus, is omitted herein. The core member 110 described with reference to FIG. 15 may be also be used in the first semiconductor package 100 shown in FIGS. 12 and 13.

As set forth above, according to an exemplary embodiment in the present disclosure, a semiconductor package may provide enhanced heat dissipation characteristics as one effect of various effects according the present disclosure.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

What is claimed is:

1. A semiconductor package comprising:
    an interposer substrate comprising:
        an insulating layer;
        a conductive wiring layer provided in the insulating layer; and
        a passivation layer;
    a first semiconductor package disposed on a first surface of the interposer substrate and comprising:
        a wiring substrate electrically connected to the interposer substrate;
        at least one first semiconductor chip disposed on the wiring substrate; and
        a first encapsulant for encapsulating at least a portion of the at least one first semiconductor chip; and
    a heat dissipation cover provided on the first surface of the interposer substrate to cover at least two lateral surfaces of the first semiconductor package and comprising an opening to expose an entire upper surface of the first encapsulant,
    wherein a lower surface of the heat dissipation cover is conductively connected to the conductive wiring layer to dissipate heat generated from the at least one first semiconductor chip, and
    wherein an upper surface of the heat dissipation cover is coplanar with an upper surface of the first encapsulant or is positioned lower than the upper surface of the first encapsulant.

2. The semiconductor package of claim 1, wherein the lower surface of the heat dissipation cover is conductively connected to the conductive wiring layer via an adhesive layer.

3. The semiconductor package of claim 1, wherein the lower surface of the heat dissipation cover is conductively connected to the conductive wiring layer via the passivation layer.

4. The semiconductor package of claim 1, wherein the heat dissipation cover comprises:
    an upper portion having the opening with the first semiconductor package disposed thereon; and
    a lateral surface portion extending from the upper portion along the at least two lateral surfaces of the first semiconductor package.

5. The semiconductor package of claim 4, wherein an angle formed between the upper portion and the lateral surface portion is between 90° and 140°.

6. The semiconductor package of claim 4, wherein the lateral surface portion extends along all of lateral surfaces of the first semiconductor package.

7. The semiconductor package of claim 6, wherein portions of the lateral surface portion respectively extending along two adjacent lateral surfaces of the first semiconductor package are spaced apart from each other.

8. The semiconductor package of claim 4, wherein the heat dissipation cover is bent in opposite directions from upper and lower ends of the lateral surface portion.

9. The semiconductor package of claim 4, wherein the upper portion and the lateral surface portion are connected by an adhesive cover.

10. The semiconductor package of claim 1, wherein the heat dissipation cover is spaced apart from a lateral surface of the first semiconductor package.

11. The semiconductor package of claim 1, wherein in a plan view of the semiconductor package, the first semiconductor package has a smaller surface area than that of the interposer substrate.

12. The semiconductor package of claim 1, wherein the first semiconductor package further includes a connection terminal electrically connecting the wiring substrate to the interposer substrate.

13. The semiconductor package of claim 1, further comprising:
a second semiconductor package provided on a second surface opposite to the first surface of the interposer substrate and comprising:
a core having a through-hole;
a second semiconductor chip disposed in the through-hole of the core and having an active surface with a connection pad disposed thereon and a non-active surface opposing the active surface;
a second encapsulant for encapsulating at least a portion of the second semiconductor chip; and
a connection layer disposed on the active surface of the second semiconductor chip and including a redistribution layer electrically connected to the connection pad of the second semiconductor chip.

14. The semiconductor package of claim 13, wherein the interposer substrate is disposed between the first semiconductor package and the second semiconductor package.

15. A semiconductor package comprising:
an interposer substrate comprising:
an insulating layer;
a conductive wiring layer provided in the insulating layer; and
a passivation layer;
a first semiconductor package disposed on a first surface of the interposer substrate and comprising:
a wiring substrate electrically connected to the interposer substrate;
at least one first semiconductor chip disposed on the wiring substrate; and
a first encapsulant for encapsulating at least a portion of the at least one first semiconductor chip;
a heat dissipation cover provided on a second semiconductor package to cover at least two lateral surfaces of the first semiconductor package and at least two lateral surfaces of the interposer substrate, the heat dissipation cover comprising:
an upper portion having an opening with the first semiconductor package disposed in the opening, the opening exposing an entire upper surface of the first encapsulant; and
a lateral surface portion extending from the upper portion along the at least two lateral surfaces of the first semiconductor package,
wherein a lower surface of the heat dissipation cover is conductively connected to the second semiconductor package to dissipate heat generated from a second semiconductor chip,
wherein an upper surface of the heat dissipation cover is coplanar with an upper surface of the first encapsulant or is positioned lower than the upper surface of the first encapsulant, and
wherein an angle formed between the upper portion and the lateral surface portion is between 90° and 140°.

16. A semiconductor package comprising:
a first semiconductor package comprising:
a wiring substrate; and
at least one first semiconductor chip disposed on the wiring substrate;
a second semiconductor package comprising:
a second semiconductor chip having an active surface with a connection pad disposed thereon and a non-active surface opposing the active surface;
an encapsulant for encapsulating at least a portion of the second semiconductor chip;
a wiring layer provided on a periphery of the second semiconductor chip; and
a connection layer disposed on the active surface of the second semiconductor chip and including a redistribution layer electrically connected to the connection pad of the second semiconductor chip;
an interposer substrate disposed between the first semiconductor package and the second semiconductor package; and
a heat dissipation cover disposed on the second semiconductor package and covering at least two lateral surfaces of the first semiconductor package and at least two lateral surfaces of the interposer substrate, the heat dissipation cover comprising an opening exposing an entire upper surface of the first semiconductor package,
wherein a lower surface of the heat dissipation cover is conductively connected to the wiring layer of the second semiconductor package to dissipate heat generated from the second semiconductor chip, and
wherein an upper surface of the heat dissipation cover is coplanar with the upper surface of the first semiconductor package or is positioned lower than the upper surface of the first semiconductor package.

17. The semiconductor package of claim 16, wherein the lower surface of the heat dissipation cover is adhered to the wiring layer by an adhesive layer.

18. The semiconductor package of claim 16, wherein the second semiconductor package further includes a core having a through-hole, and
Wherein the second semiconductor chip is disposed in the through-hole of the core.

19. The semiconductor package of claim 18, wherein the core includes a core insulating layer and the wiring layer disposed on the core insulating layer.

20. The semiconductor package of claim 16, wherein in a plan view of the semiconductor package, each of the first semiconductor package and the interposer substrate has a smaller surface area than that of the second semiconductor package.

* * * * *